United States Patent
Furukawa et al.

(12)

(10) Patent No.: US 9,293,572 B2
(45) Date of Patent: Mar. 22, 2016

(54) POWER SEMICONDUCTOR DEVICE

(75) Inventors: Akihiko Furukawa, Tokyo (JP);
Yasuhiro Kagawa, Tokyo (JP);
Naruhisa Miura, Tokyo (JP); Shiro Hino, Tokyo (JP); Shuhei Nakata, Tokyo (JP); Kenichi Ohtsuka, Tokyo (JP); Shoyu Watanabe, Tokyo (JP); Masayuki Imaizumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/806,534

(22) PCT Filed: Jun. 24, 2010

(86) PCT No.: PCT/JP2010/004193
§ 371 (c)(1),
(2), (4) Date: Mar. 8, 2013

(87) PCT Pub. No.: WO2011/161721
PCT Pub. Date: Dec. 29, 2011

(65) Prior Publication Data
US 2013/0168700 A1    Jul. 4, 2013

(51) Int. Cl.
*H01L 29/15*    (2006.01)
*H01L 29/78*    (2006.01)
(Continued)

(52) U.S. Cl.
CPC .............. *H01L 29/78* (2013.01); *H01L 27/088* (2013.01); *H01L 29/6606* (2013.01); *H01L 29/66068* (2013.01); *H01L 29/7805* (2013.01);
(Continued)

(58) Field of Classification Search
CPC . H01L 29/7815; H01L 23/60; H01L 27/0296; H01L 29/12; H01L 21/0445

USPC .................................................... 257/77, 401
See application file for complete search history.

(56) References Cited

U.S. PATENT DOCUMENTS 5,303,110 A    4/1994 Kumagai
5,369,045 A *  11/1994 Ng et al. ....................... 438/286
(Continued)

FOREIGN PATENT DOCUMENTS

JP    3 69159    3/1991
JP    5 21787    1/1993
(Continued)

OTHER PUBLICATIONS

Translation of JP2006-093459A, Japan, Hideshi et al., Apr. 2006.*
(Continued)

*Primary Examiner* — Matthew Landau
*Assistant Examiner* — Eric Ashbahian
(74) *Attorney, Agent, or Firm* — Oblon, McClelland, Maier & Neustadt, L.L.P.

(57) ABSTRACT

In a high speed switching power semiconductor device having a sense pad, a high voltage is generated during switching operations in well regions under the sense pad due to a displacement current flowing through its flow path with a resistance, whereby the power semiconductor device sometimes breaks down by dielectric breakdown of a thin insulating film such as a gate insulating film. In a power semiconductor device according to the invention, sense-pad well contact holes are provided on well regions positioned under the sense pad and penetrate a field insulating film thicker than the gate insulating film to connect to the source pad, thereby improving reliability.

16 Claims, 14 Drawing Sheets

(51) Int. Cl.
  *H01L 29/66* (2006.01)
  *H01L 27/088* (2006.01)
  *H01L 29/06* (2006.01)
  *H01L 21/04* (2006.01)
  *H01L 29/45* (2006.01)

(52) U.S. Cl.
  CPC ......... *H01L29/7815* (2013.01); *H01L 21/0485* (2013.01); *H01L 29/0696* (2013.01); *H01L 29/45* (2013.01)

(56) References Cited

U.S. PATENT DOCUMENTS

| | | | |
|---|---|---|---|
| 5,563,435 | A | 10/1996 | Kohno et al. |
| 5,719,420 | A | 2/1998 | Kohno et al. |
| 5,828,263 | A | 10/1998 | Gantioler et al. |
| 5,844,760 | A | 12/1998 | Kumagai et al. |
| 7,385,250 | B2 * | 6/2008 | Omura et al. ................. 257/341 |
| 2007/0152274 | A1 * | 7/2007 | Yoshimochi ................. 257/355 |
| 2008/0001221 | A1 | 1/2008 | Yoshimura et al. |
| 2008/0230810 | A1 | 9/2008 | Yoshimura |
| 2010/0090271 | A1 * | 4/2010 | Hefner et al. ................. 257/328 |
| 2012/0205669 | A1 | 8/2012 | Miura et al. |
| 2013/0020587 | A1 | 1/2013 | Hino et al. |

FOREIGN PATENT DOCUMENTS

| | | | | |
|---|---|---|---|---|
| JP | 5 198816 | | 8/1993 | |
| JP | 7 263641 | | 10/1995 | |
| JP | 8 46193 | | 2/1996 | |
| JP | 8 236770 | | 9/1996 | |
| JP | 9 186329 | | 7/1997 | |
| JP | 10 56174 | | 2/1998 | |
| JP | 11 345965 | | 12/1999 | |
| JP | 2000 323707 | | 1/2000 | |
| JP | 2002 314079 | | 10/2002 | |
| JP | 2005-175301 | A | 6/2005 | |
| JP | 2006-093459 | A * | 4/2006 | ............ H01L 21/336 |
| JP | 2008 10723 | | 1/2008 | |
| JP | 2008 235788 | | 10/2008 | |
| JP | 2009 176884 | | 8/2009 | |

OTHER PUBLICATIONS

Translation of JP2000-323707A, Japan, Yoshito et al., Nov. 2000.*
U.S. Appl. No. 13/992,574, filed Jun. 7, 2013, Kagawa, et al.
Office Action issued Feb. 25, 2014, in Japanese Patent Application No. 2012-521167 with partial English translation.
Office Action issued Feb. 13, 2015, in Korean Patent Application No. 10-2012-7033412 (with partial English language translation).
Office Action issued Nov. 2, 2014 to Chinese patent application No. 201080067692.1 (with English translation).
Office Action in Korean Patent Application No. 10-2012-7033412, issued Aug. 20, 2014, with Partial English Translation.

* cited by examiner (a)

(b)

(a)

(b)

POWER SEMICONDUCTOR DEVICE

TECHNICAL FIELD

This invention relates to power semiconductor devices such as a silicon carbide semiconductor.

BACKGROUND ART

In a power semiconductor device, it is known that the power semiconductor device has a structure in which a current detection element is provided on the same substrate so that the device is capable of being isolated in response to an overcurrent detection to protect the device (for example, Patent document 1). Patent document 1 describes a structure of a semiconductor device, such as an IGBT (Insulated Gate Bipolar Transistor), in which a current detection element for the semiconductor device is provided on the same substrate and a p-type region similar to a base region is formed under a current detection bonding pad for the current detection element.

Patent document 2 describes a power semiconductor device configured with a vertical power MOSFET (Metal Oxide Semiconductor Field Effect Transistor) and diodes; and, FIG. 1 and FIG. 2 in the document shows that at least one line of diodes is arranged in the periphery of a MOSFET cell region, i.e. in a region adjacent to a gate pad. When the MOSFET switches from ON state to OFF state, each of the diodes absorbs holes that are, when biased forward, injected to an N-type semiconductor layer in a drain side from a P-well and a P-base shown in FIG. 2 of the document. Therefore, when the MOSFET is switched from a forward bias to a backward bias, the structure described in the document can prevent a parasitic transistor shown in FIG. 3 of the document from turning ON.

FIG. 2 of the document shows that in the structure mentioned above, the P-base that is the P-well of the MOSFET is electrically connected to a source electrode through a back gate.

PRIOR ART DOCUMENT

Patent Document

[Patent document 1] Japanese Patent Laid-Open No. H08-46193 (page 3, FIG. 19 to FIG. 20)

[Patent document 2] Japanese Patent Laid-Open No. H05-198816 (FIG. 1 to FIG. 3)

SUMMARY OF THE INVENTION

Problem to be Solved by the Invention

The problems to be solved by the present invention will be explained below, mainly according to FIG. 2 of Patent document 2.

When a MOSFET of a power semiconductor device described in Patent document 2 is switched from an ON state to an OFF state, a drain voltage of the MOSFET, that is, the voltage of the drain electrode in some cases rises rapidly to reach several hundred volts. This drain voltage rise produces displacement currents on a drain electrode side and a source electrode side through a depletion-layer capacitance that emerges between a P-well and an N⁻ drain layer in the OFF state. If there are P-wells or portions in which P-type regions are provided in the N⁻ drain layer in the same manner as P-wells, this displacement current is produced not only in the P-wells of the MOSFET but also in diodes.

The displacement currents produced as above flow in a manner that the one produced in the drain electrode side directly flows into the drain electrode, but the one produced in the source electrode side flows into the source electrode through the P-wells or the P-type regions.

In a case of the power semiconductor device described in Patent document 2, its source electrode and field plate are electrically connected in a manner described in the prior art of the document; thus, for example in a section shown in FIG. 2(C), a displacement current having flown into a P-well under a gate pad flows within the P-well under the gate pad in a direction from a MOSFET cell direction toward a contact hole connected to the field plate, and then flows into the source electrode through the field plate.

A P-well area under the gate pad is extremely larger than the areas of P-wells of the MOSFET cell and a diode cell; therefore, the displacement current flowing in the P-well under the gate pad produces a non-negligible voltage in the P-well, because the P-well itself with the large area and the contact hole have somewhat large resistances. This results in producing a relatively large electric potential at a location in the P-well that is far in a planar direction from a portion (a contact hole) at which a P-well is electrically connected through the field plate to a source electrode (typically, connected to the ground potential).

This electric potential is increased as the displacement current increases, and as a variation dV/dt in the drain voltage V with respect to time t increases.

This electric potential is produced not only in the P-well under the gate pad but also in a P-well under a pad having a large area such as a current detection bonding pad connected to a current detection element in Patent document 1.

SUMMARY OF THE INVENTION

A power semiconductor device according to the present invention includes: a semiconductor substrate of a first conductivity type; a drift layer of the first conductivity type that is formed on a first main face side of the semiconductor substrate; a plurality of main-cell well regions of a second conductivity type that are formed side by side in upper surface portions of the drift layer; a plurality of sense-cell well regions of the second conductivity type that are formed side by side in upper surface portions of the drift layer, apart from the main-cell well regions; a sense-pad well region of the second conductivity type that is formed to surround the sense-cell well regions, apart from the sense-cell well regions and the main-cell well regions, and has an area larger than each of the main-cell well regions and the sense-cell well regions; a gate insulating film that is formed on the sense-cell well regions and the main-cell well regions; a field insulating film that is formed on the sense-pad well region so as to be thicker than the gate insulating film; a source pad that electrically connects the sense-pad well region and the main-cell well regions through sense-pad well contact holes which are formed on the sense-pad well region so as to penetrate the field insulating film and source contact holes which are formed on the main-cell well regions so as to penetrate the gate insulating film; a sense pad that is electrically connected to the sense-cell well regions through sense source contact holes which are formed on the sense-cell well regions so as to penetrate the gate insulating film; gate electrodes that are formed in contact with the gate insulating film, above the main-cell well regions and the sense-cell well regions; a gate pad that is electrically connected to the gate electrodes; and a drain electrode that is formed on a second main face side of the semiconductor substrate that is opposite to the first main face.

Effect of the Invention

According to a power semiconductor device of the present invention, even if the power semiconductor device including a sensor such as a current sensor to monitor a current value or the like is provided with a sensor pad and is driven at high speed, a strong electric field is not applied to its gate insulating films, so that the gate insulating films can be prevented from dielectric breakdown. This can provide higher reliability to the power semiconductor device.

MODES FOR CARRYING OUT THE INVENTION

Embodiment 1

In Embodiment 1 of the present invention, explanation is made using a device mainly consisting of vertical n-type-channel silicon carbide MOSFETs as an example of a power semiconductor device including a current sensor. In the embodiments described below, explanation is made under an assumption that "first conductivity type" corresponds to n-type and "second conductivity type" corresponds to p-type; however, regarding conductivity types of semiconductor, the correspondence may be reversed.

Figure 1:
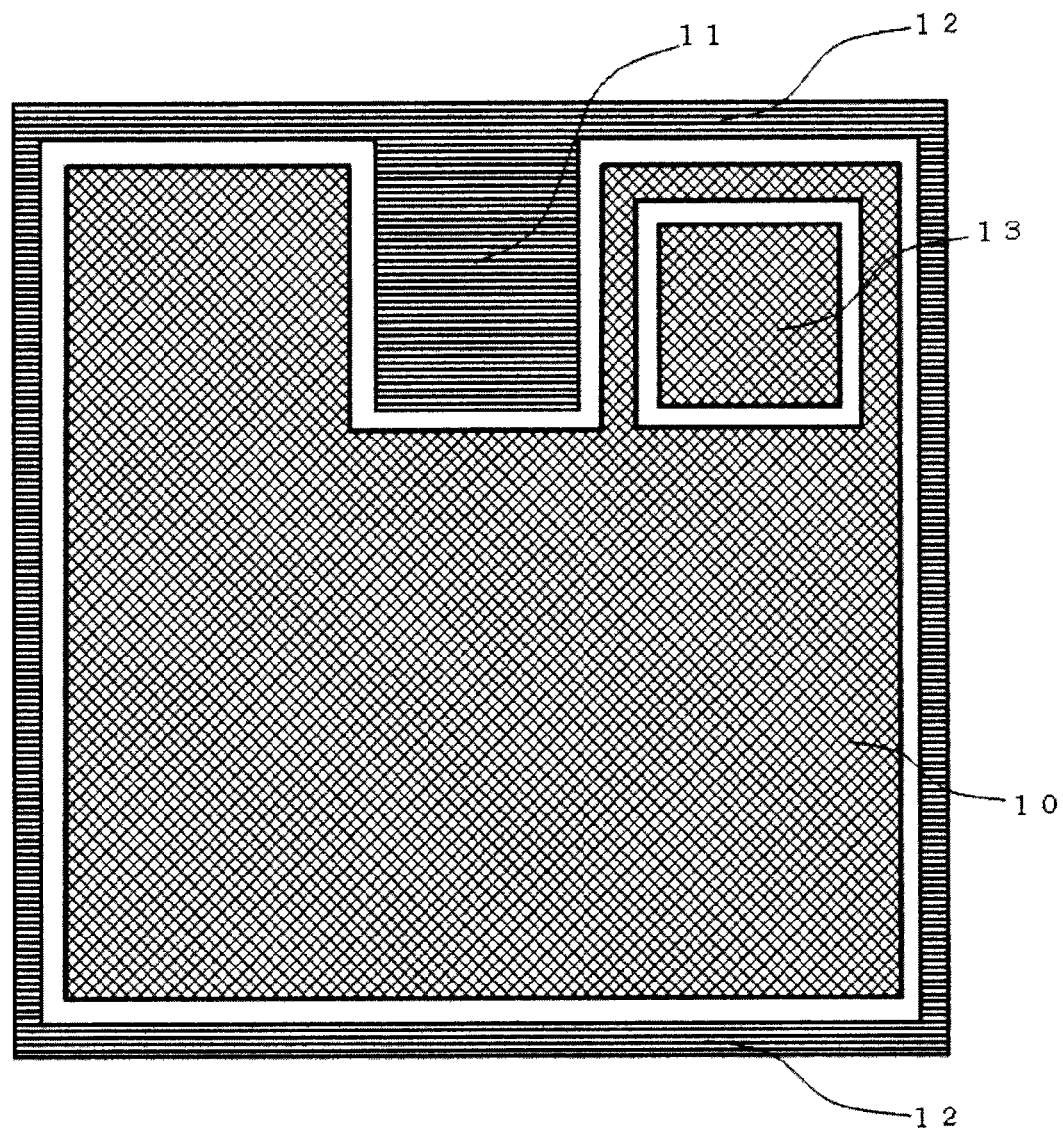
FIG. 1 is a schematic plan view of a power semiconductor device according to Embodiment 1 of the present invention.

FIG. 1 is a schematic top view of a power semiconductor device according to Embodiment 1 of the present invention in which silicon carbide MOSFETs are mainly used. In FIG. 1, a source pad 10 is formed at a central portion of the top face of the power semiconductor device. When the source pad 10 is seen from above its top face, a gate pad 11 is formed on one side of the device. Gate wiring 12 is formed to extend from the gate pad 11 so as to surround the source pad 10. In a portion within the source pad 10, a sense pad 13 is formed.

The source pad 10 is electrically connected to sources of MOSFETs in a plurality of main cells provided under the source pad 10; the sense pad 13 is electrically connected to sources of MOSFETs in a plurality of sense cells provided under the sense pad 13. The gate pad 11 and the gate wiring 12 are electrically connected to gates of the MOSFETs in the main cells and the sense cells to apply to gate electrodes, a gate voltage supplied from an external control circuit.

Figure 2:
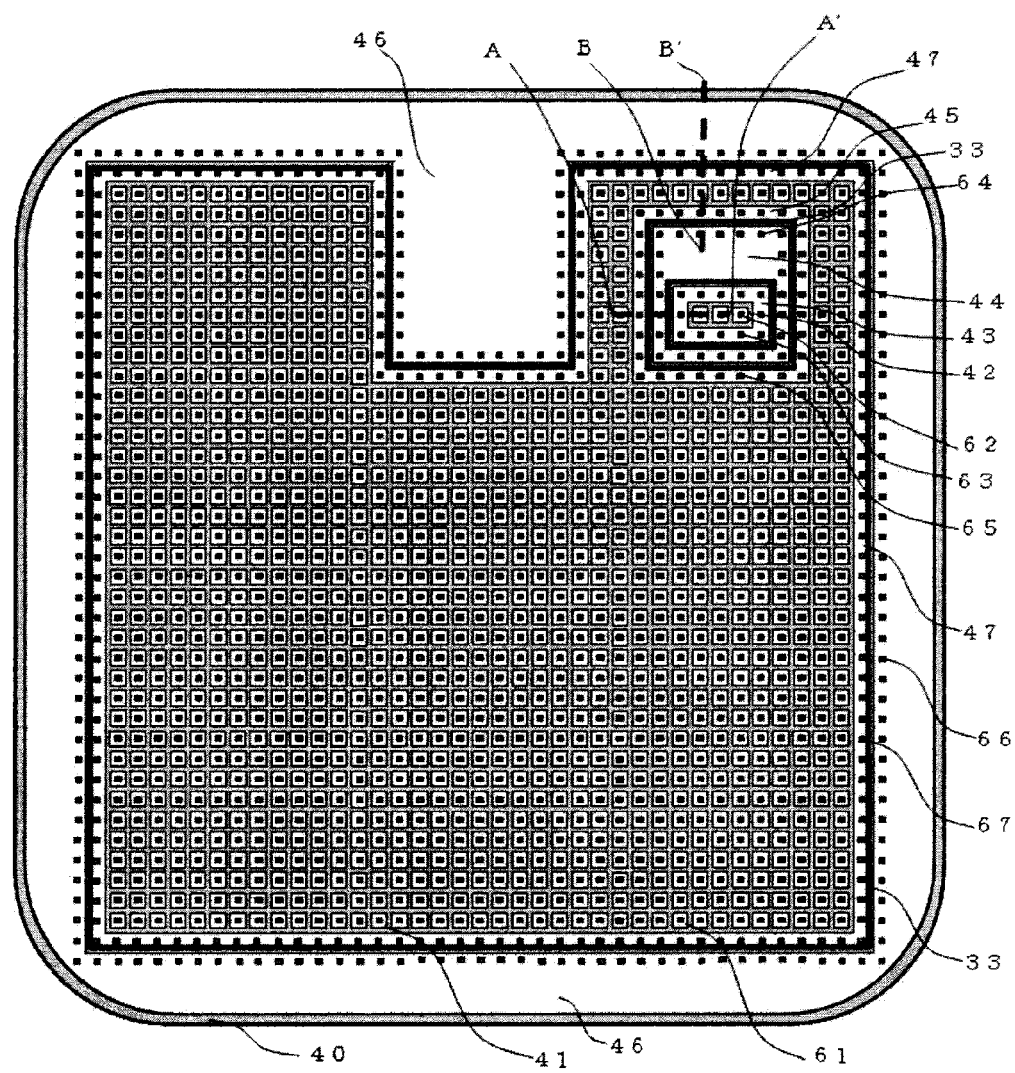
FIG. 2 is another schematic plan view of the power semiconductor device according to Embodiment 1 of the present invention.

FIG. 2 is a plan view of the power semiconductor device according to the embodiment, in which an underlying layer is seen from the above through a layer including the source pad 10, the gate pad 11 and the like shown in FIG. 1. In FIG. 2, a plurality of holes called as sense source contact hole 62 are formed under the sense pad 13 shown in FIG. 1 so as to penetrate an insulating film such as an interlayer insulating film (not show in the figure). In a silicon carbide layer under the sense source contact holes 62, respective sense-cell well regions 42 of p-type silicon carbide are formed.

In the top view, a sense-cell-periphery well region 43 and sense-cell-periphery well contact holes 63 are formed so as to surround the plurality of sense source contact holes 62 and the sense-cell well regions 42. The sense-cell-periphery well contact holes 63 are formed so as to penetrate an insulating film such as an interlayer insulating film, and the sense-cell-periphery well region 43 is formed in the silicon carbide layer positioned under the sense-cell-periphery well contact holes 63 so as to exhibit a p-type property.

In the top view, a sense-pad well region 44 and sense-pad well contact holes 64 are formed under the sense pad 13 and outside the sense-cell-periphery well region 43 and the sense-cell-periphery well contact holes 63. The sense-pad well contact holes 64 are formed so as to penetrate an insulating film such as an interlayer insulating film, and the sense-pad well region 44 is formed in the silicon carbide layer so as to exhibit a p-type property.

In the top view, a sense-pad-boundary well region 45 and sense-pad-boundary well contact holes 65 are formed within and under the source pad 10 along the boundary between the source pad 10 and the sense pad 13, so as to surround the sense-pad well region 44 and the sense-pad well contact holes 64. Sense-pad-boundary well contact holes 65 are formed so as to penetrate an insulating film such as an interlayer insulating film, and a sense-pad-boundary well region 45 is formed in the silicon carbide layer so as to exhibit a p-type property.

In the top view, the many main cells are formed under the source pad 10 so as to surround the sense-pad-boundary well region 45 and the sense-pad-boundary well contact holes 65. In each of the main cells, a main-cell well region 41 of p-type silicon carbide is formed in the silicon carbide layer positioned under a source contact hole 61 which is formed by penetrating the insulating film such as the interlayer insulating film.

In the top view, a periphery-boundary well region 47 and periphery-boundary-well contact holes 67 are formed under the periphery of the source pad 10 so as to surround the many main cells; outside the periphery, a periphery well region 46 and periphery-well contact holes 66 are formed. The periphery-boundary well region 47 and the periphery well region 46 are made of p-type silicon carbide, and the periphery-boundary-well contact holes 67 and the periphery-well contact holes 66 are formed so as to penetrate the insulating film such as an interlayer insulating film.

The periphery well region 46 extends to an area under the gate pad 11; the gate wiring 12 having been explained in FIG. 1 is formed above the periphery well region 46 which serves as a periphery portion.

In a region that is a portion of the silicon carbide and outside the periphery well region 46, a junction termination extension (JTE) region 40 of p-type is formed.

Gate insulating films (not shown in the figure) are formed on top faces of silicon carbide regions such as the main-cell well regions 41, the sense-cell well regions 42, the sense-cell-periphery well region 43, the sense-pad-boundary well region 45, the periphery-boundary well region 47, and some portions of a drift layer 21; field insulating films (not shown in the figure) thicker than the gate insulating films are formed on top faces of silicon carbide regions such as the sense-pad well region 44, the periphery well region 46, and some portions of the drift layer 21. In the plan view FIG. 2, gate-insulating-film field-insulating-film boundaries 33 are the boundaries between the gate insulating films and the field insulating films.

Figure 3:
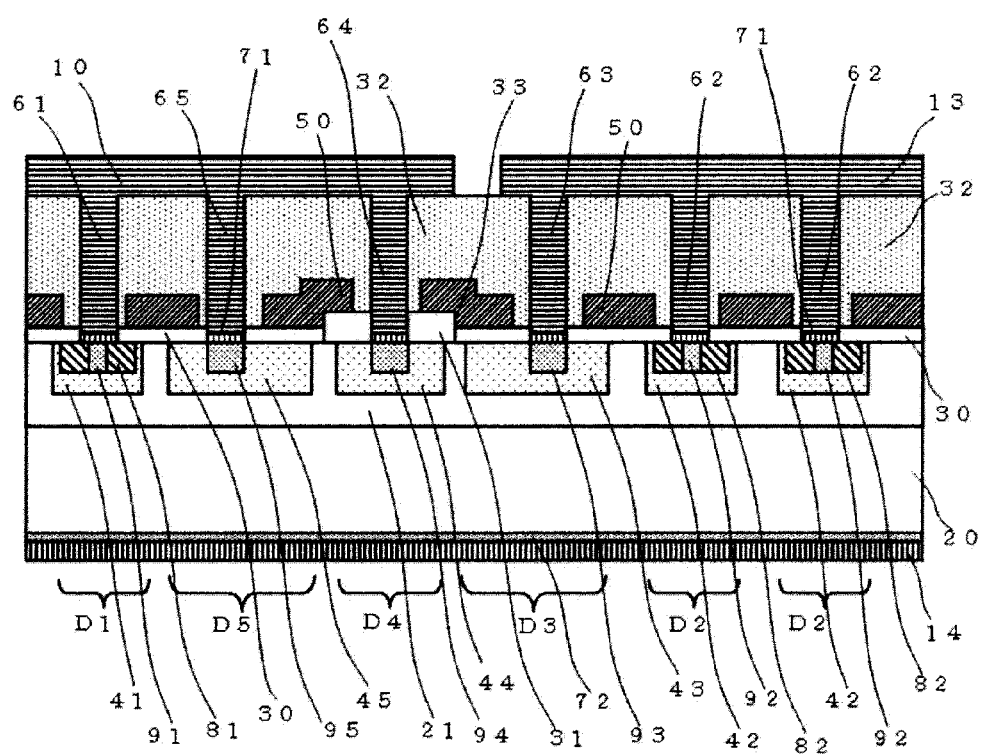
FIG. 3 is a cross-sectional view schematically illustrating a cross section of a portion of the power semiconductor device according to Embodiment 1 of the present invention.
Figure 4:
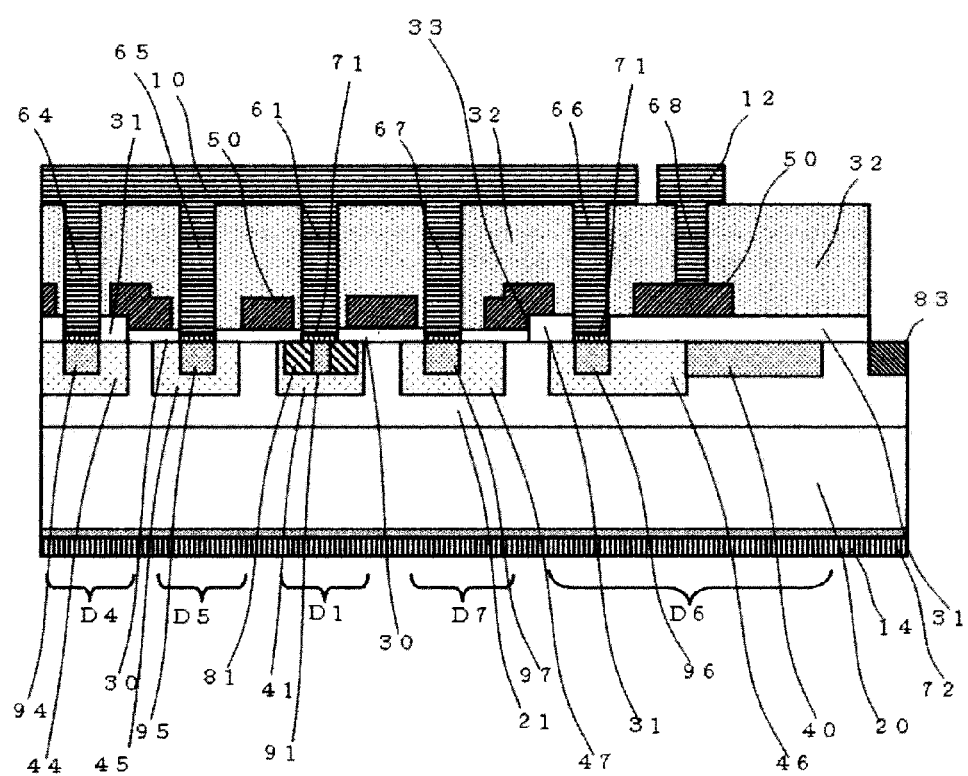
FIG. 4 is a cross-sectional view schematically illustrating a cross section of another portion of the power semiconductor device according to Embodiment 1 of the present invention.

FIG. 3 and FIG. 4 are partial schematic cross-sectional views of the power semiconductor device according to the present embodiment, taken along A-A' and B-B' in the plan view of FIG. 2, respectively.

FIG. 3 and FIG. 4 show that the drift layer 21 of n-type silicon carbide is formed on the top surface of the substrate 20 of n-type silicon carbide having a low resistance. In some upper surface regions of the drift layer 21 below the sense pad 13, a plurality of the sense-cell well regions 42 of p-type silicon carbide is formed. At a predetermined distance in a lateral direction along the cross section apart from one of the sense-cell well regions 42, the sense-cell-periphery well region 43 of p-type silicon carbide is formed in an upper surface region of the drift layer 21.

At a predetermined distance in the lateral direction along the cross section apart from the sense-cell-periphery well region 43, the sense-pad well region 44 of p-type silicon carbide is formed in an upper surface region of the drift layer 21. At a predetermined distance apart from the sense-pad well region 44, the sense-pad-boundary well region 45 is formed in an upper surface region of the drift layer 21.

At a predetermined distance in the lateral direction along the cross section apart from the sense-pad-boundary well region 45, a number of the main-cell well regions 41 of p-type silicon carbide are formed in upper surface regions of the drift layer 21.

In an upper surface region of the drift layer 21 (the right side of FIG. 4) that extends outside the main cell region where the many main-cell well regions 41 are formed when viewed from the top side of the power semiconductor device of the present embodiment, the periphery-boundary well region 47 of p-type silicon carbide is formed at a predetermined distance apart from the outermost main-cell well regions 41. In a further outer upper surface region of the drift layer 21 (the right side of FIG. 4) that extends outside the periphery-boundary well region 47, the periphery well region 46 of p-type silicon carbide is formed at a predetermined distance apart from the periphery-boundary well region 47. In a further outer upper surface region of the drift layer 21 (the right side of FIG. 4) that extends outside the periphery well region 46, the JTE region 40 of the p-type silicon carbide is formed. Although not illustrated in FIG. 2, a field stopper region 83 of n-type silicon carbide is formed outside the JTE region 40 (the right side of FIG. 4) at a predetermined distance apart.

In the inner side in a cross-sectional lateral direction of an upper surface region of each main-cell well region 41, a main source region 81 of n-type is formed; and in the further inner side of the region formed is a contact region 91 of p-type with low resistance. In the same manner, in the inner side in a cross-sectional lateral direction of an upper surface region of each of the sense-cell well regions 42, a sense source region 82 of n-type is formed; and in the further inner side of the region formed is a contact region 92 of p-type with low resistance. Field insulating films 31 are formed on the sense-pad well region 44, the periphery well region 46, and the JTE region 40; gate insulating films 30 are formed on the main-cell well regions 41, the sense-cell well regions 42, the sense-cell-periphery well region 43, the sense-pad-boundary well region 45, and the periphery-boundary well region 47.

Gate electrodes 50 are partially formed on the gate insulating films 30 and the field insulating films 31; an interlayer insulating film 32 is formed on the gate insulating films 30, the field insulating films 31, and the gate electrodes 50. As explained in FIG. 2, at predetermined positions in the gate insulating films 30, the field insulating films 31, and the interlayer insulating film 32, formed are the source contact holes 61, the sense source contact holes 62, the sense-cell-periphery well contact holes 63, the sense-pad well contact holes 64, the sense-pad-boundary well contact holes 65, the periphery-well contact holes 66, and the periphery-boundary-well contact holes 67. Contact regions 91 to 97 of p-type silicon carbide with low resistance are formed under the source contact holes 61, the sense source contact holes 62, the sense-cell-periphery well contact holes 63, the sense-pad well contact holes 64, the sense-pad-boundary well contact holes 65, the periphery-well contact holes 66, and the periphery-boundary-well contact holes 67, respectively.

The sense pad 13 is formed so as to connect the sense source contact holes 62 and the sense-cell-periphery well contact holes 63. The source pad 10 is formed so as to connect the source contact holes 61, the sense-pad well contact holes 64, the sense-pad-boundary well contact holes 65, the periphery-boundary-well contact holes 67, and the periphery-well contact holes 66.

To reduce the resistance between each of the well regions 41 to 47 and the source pad 10 or the sense pad 13, an ohmic electrode 71 is formed at each bottom of the source contact holes 61, the sense source contact holes 62, the sense-cell-periphery well contact holes 63, the sense-pad well contact holes 64, the sense-pad-boundary well contact holes 65, the periphery-well contact holes 66, and the periphery-boundary-well contact holes 67. A drain electrode 14 is formed on the opposite side of the substrate 20 with a back ohmic electrode 72 interposed therebetween.

Gate contact holes 68 for connecting between the gate electrodes 50 on the field insulating film 31, and the gate wiring 12 or the gate pad 11 are formed so as to penetrate the interlayer insulating film 32.

In the above configuration, a p-n diode is formed between the n-type drift layer 21 and each of the p-type well regions (41 to 47) in the power semiconductor device according to the embodiment. That is, there are formed a main-MOS diode (D1) for each main-cell well region 41, a sense-MOS diode (D2) for each sense-cell well region 42, a sense-cell-periphery diode (D3) for the sense-cell-periphery well region 43, a sense-pad diode (D4) for the sense-pad well region 44, and a sense-pad-boundary diode (D5) for the sense-pad-boundary well region 45. There are also formed a periphery-well diode (D6) between the periphery well region 46 and the drift layer 21, and a periphery-boundary-well diode (D7) between the periphery-boundary well region 47 and the drift layer 21. A diode between the JTE region 40 and the drift layer 21 is connected to the periphery-well diode (D6); therefore, the diode is considered as a part of the periphery-well diode (D6).

Figure 5:
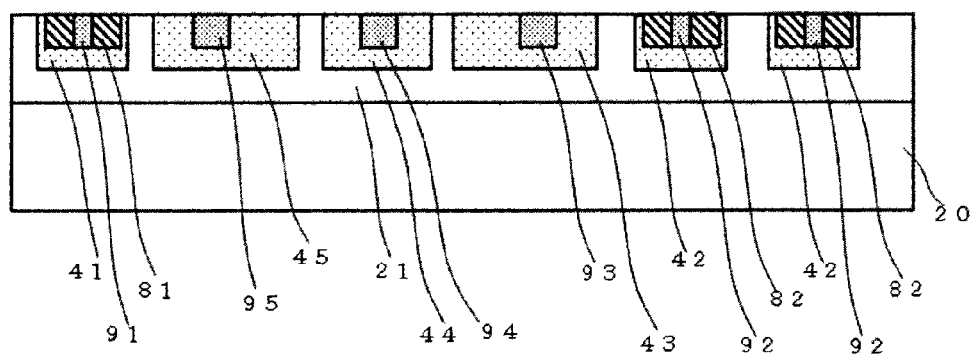
FIG. 5 includes cross-sectional views schematically illustrating a portion of the power semiconductor device according to Embodiment 1 of the present invention for explaining manufacturing steps of the power semiconductor device.
Figure 5:
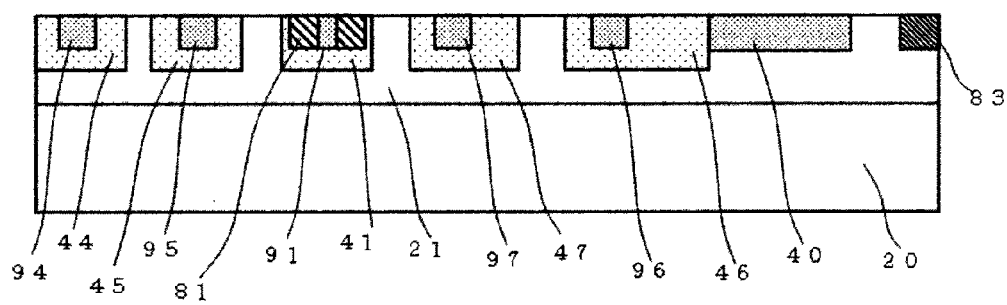
Figure 6:
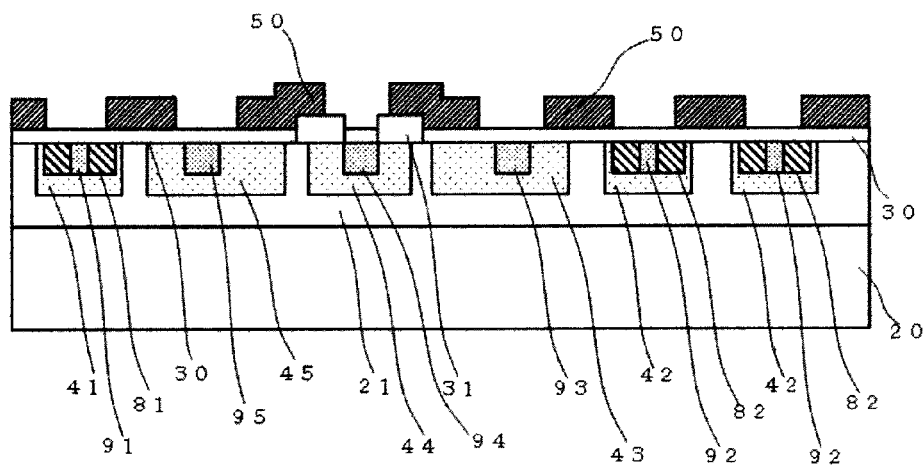
FIG. 6 includes cross-sectional views schematically illustrating another portion of the power semiconductor device according to Embodiment 1 of the present invention for explaining manufacturing steps of the power semiconductor device.
Figure 6:
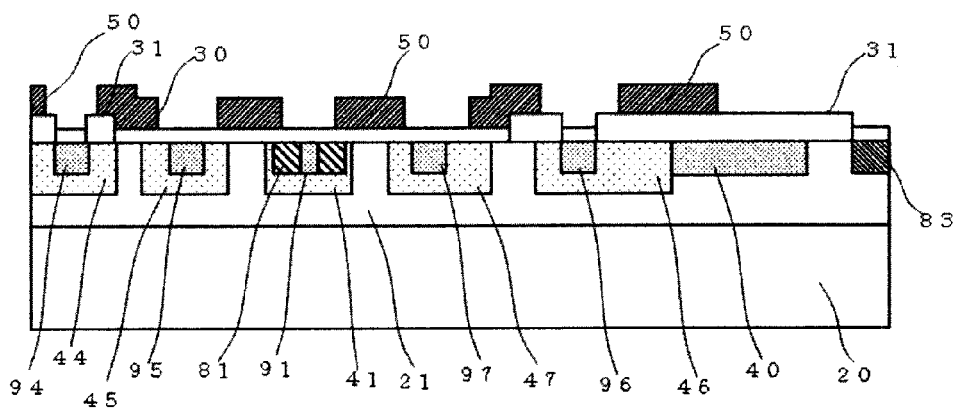

A method of manufacturing a power semiconductor device according to the embodiment will be explained, using FIG. 5 and FIG. 6. FIG. 5 and FIG. 6 are partial schematic cross-sectional views of the power semiconductor device for explaining manufacturing steps of the power semiconductor device according to the embodiment; in FIG. 5 and FIG. 6, each of '(a)'-views corresponds to a cross-sectional view taken along A-A' in FIG. 2, and each of '(b)'-views corresponds to a cross-sectional view taken along B-B' in FIG. 2.

The method of the power semiconductor device according to the embodiment will be explained below in order.

First, by a chemical vapor deposition (CVD) method, the drift layer 21 of silicon carbide is epitaxially grown on a surface (first main face) of the n-type silicon carbide semiconductor substrate 20 having a low resistance, so that the drift layer has an n-type impurity concentration of $1\times10^{13}$ $cm^{-3}$ to $1\times10^{18}$ $cm^{-3}$ and a thickness of 4 to 200 μm. As the silicon carbide semiconductor substrate 20, a silicon carbide semiconductor substrate of 4H polytype is used, the face orientation of which is tilted 8 degrees or less from the c-axis at the (0001) face. However, other face orientations, polytypes and tilt angles may be used, and the face orientation may not be tilted.

Next, as shown in FIG. 5, the p-type main-cell well regions 41, the p-type sense-cell well regions 42, the p-type sense-cell-periphery well region 43, the p-type sense-pad well region 44, the p-type sense-pad-boundary well region 45, the p-type periphery well region 46, the p-type periphery-boundary well region 47, the p-type JTE region 40, the n-type main source regions 81, the n-type sense source regions 82, the n-type field stopper region 83, and the p-type contact regions 91 to 97 are formed at predetermined positions in the surface of the drift layer 21 by an ion implantation method. As p-type impurities for the ion implantation, Al (aluminum) or B (boron) is suitable; as n-type impurities for the ion implantation, N (nitrogen) or P (phosphorus) is suitable. During the ion implantation, the substrate 20 may not be positively heated, or may be heated at 200 to 800 degrees C.

It is necessary to set the depths of the well regions 41 to 47 and the JTE region 40 not deeper than the bottom face of the drift layer 21, i.e. the epitaxial crystal growth layer; the depths are set, for example, within a range of 0.3 to 2 μm. The p-type impurity concentrations of the well regions 41 to 47 are set at a concentration higher than the impurity concentration of the drift layer 21 and in a range between $1\times10^{15}$ $cm^{-3}$ and $1\times10^{19}$ $cm^{-3}$. The manufacturing process can be simplified by setting the same depth and impurity concentration to the well regions 41 to 47. Alternatively, by setting the impurity concentrations of the sense-pad well region 44 and the periphery well region 46 having large areas, higher than those of the rest of the well regions, a voltage produced by a displacement current described later can be lowered.

For the main source regions 81 and the sense source regions 82, their depths are set so that their bottoms are not lower than those of the main-cell well regions 41 and the sense-cell well regions 42, and their n-type impurity concentrations are set at a concentration higher than those of the p-type impurity concentrations of the main-cell well regions 41 and the sense-cell well regions 42 and within a range between $1\times10^{17}$ $cm^{-3}$ and $1\times10^{21}$ $cm^{-3}$. The field stopper region 83 is formed in the same condition as the main source regions 81 and the sense source regions 82.

However, in the top face vicinity of the drift layer 21, the respective p-type impurity concentrations of the well regions 41 to 47 may be lower than the n-type impurity concentration of the drift layer 21 to increase the conductivity of MOSFET channel regions.

The contact regions 91 to 97 are provided in a manner that the ohmic electrodes 71 are sandwiched between the contact regions and the respective well regions 41 to 47, to obtain a good electrical contact between the well regions and the source pad 10 or the sense pad 13; it is desired that the impurity concentrations of the contact regions are set higher than those of the respective p-type impurity concentrations of the well regions 41 to 47. In addition, when the high impurity ion implantation is performed, it is desired that the substrate 20 is heated at 150 degrees C. or higher for the ion implantation in order that the contact regions 91 to 97 have a low resistance.

After that, annealing is performed in an inert gas atmosphere such as argon (Ar) gas or nitrogen gas or in a vacuum at a temperature ranging from 1500 to 2200 degrees C. for 0.5 to 60 minutes to electrically activate the impurities introduced by the ion implantation,. When the annealing is performed, the substrate 20 and films formed thereon may be annealed under a condition that they are covered with a carbon film. The carbon film coverage annealing can prevent the surface of the silicon carbide from being roughed by residual moisture or residual oxygen produced in an apparatus during the annealing.

Next, the ion-implanted surface of the drift layer 21 is sacrificially oxidized to form a thermal oxidation film, and then, by removing the thermal oxidation film, the altered layer in the surface of the ion-implanted drift layer 21 is removed to expose a clean face. After that, using a CVD method, a photolithography technique, or the like, silicon dioxide films which are called as the field insulating films 31 and have a film thickness of some 0.5 to 2 μm are formed at positions except those approximately corresponding to the above-mentioned main cell region and sense cell region. Hereat, for example, a field insulating film 31 is formed over the surface, then, photolithography, etching or the like is performed to portions of the field insulating film 31 positioned approximately corresponding to both cell regions. In addition, the portions of the field insulating film 31 are removed in advance, at which the contact holes are to be formed by penetrating the field insulating film 31.

Next, as shown in the cross-sectional views in FIG. 6, the gate insulating films 30 made of silicon dioxide film are formed, using a thermal oxidation method or a deposition method, over active regions such as the main-cell well regions 41 and the sense-cell well regions 42 so as to have a thickness thinner than that of the field insulating films 31, for example as thin as around a tenth of the thickness of the field insulating films 31.

It suffices that the gate insulating films 30 have a film thickness from 30 nm to 300 nm, or more preferably from 50 nm to 150 nm. In addition, this film thickness depends on the levels of the gate voltage and the gate electric field for driving (switching) MOSFET; thus preferably it suffices that the gate electric field (the electric field applied to the gate insulating films 30) is 3 MV/cm or less.

Next, as shown in FIG. 6, gate electrodes 50 of polysilicon material are formed at predetermined positions on the gate insulating films 30 and the field insulating films 31, by using a CVD method, a photolithography technique or the like. It is preferable that the polysilicon used for the gate electrodes 50 includes "P" or "B" to have a low resistance. "P" or "B" may be introduced during the polysilicon film formation, or it may be introduced by an ion implantation method after the film formation.

Next, on the gate electrodes 50 and the like, the interlayer insulating film 32 made of silicon dioxide film is formed by a deposition method such as a CVD method. Next, by using a photolithography technique and a dry etching technique, portions of the interlayer insulating film 32 are removed at which the source contact holes 61, the sense source contact holes 62, the sense-cell-periphery well contact holes 63, the sense-pad well contact holes 64, the sense-pad-boundary well contact holes 65, the periphery-boundary-well contact holes 67, and the periphery-well contact holes 66 are to be formed. At this moment, gate contact holes 68 described later may be formed at the same time to simplify manufacturing steps.

Next, metal films whose principal constituent is Ni are formed by a sputtering method or the like; and then, heat treatment is performed at a temperature between 600 and 1100 degrees C. so that the metal films whose principal constituent is Ni react with the silicon carbide layer, to form silicide between the silicon carbide layer and the metal films. Next, metal film portions other than the silicide that remain unreacted on the interlayer insulating film 32 are removed by wet etching with any one of sulfuric acid, nitric acid and hydrochloric acid or with hydrogen peroxide solution mixture with one of the acids.

The silicide portions formed as above in the source contact holes 61, the sense source contact holes 62, the sense-cell-periphery well contact holes 63, the sense-pad well contact holes 64, the sense-pad-boundary well contact holes 65, the periphery-boundary-well contact holes 67 and the periphery-well contact holes 66 serve as the ohmic electrodes 71 shown in FIG. 3 and FIG. 4 to ohmically connect to both of n-type silicon carbide regions such as the main source regions 81 and p-type silicon carbide regions such as the main-cell well regions 41.

Further, portions of the interlayer insulating film 32 at which the gate contact holes 68 are to be formed are removed by using a photolithography technique and a dry etching technique. Next, a metal portion whose principal constituent is Ni is formed on the back face (second main face) of the substrate 20 and then is heat treated to form the back ohmic electrode 72 on the back side of the substrate 20.

After that, wiring metal such as "Al" is formed by a sputtering method or a vapor deposition method on the substrate 20 having been processed as above, and then the wiring metal is processed into predetermined shapes by a photolithography technique to form the source pad 10, the gate pad 11, the gate wiring 12 and the sense pad 13. Furthermore, the drain electrode 14 is formed by forming a metal film on the surface of the back ohmic electrode 72 at the back side of the substrate, thereby completing the manufacturing of the power semiconductor device whose cross-sectional views are shown in FIG. 3 and FIG. 4.

Figure 7:
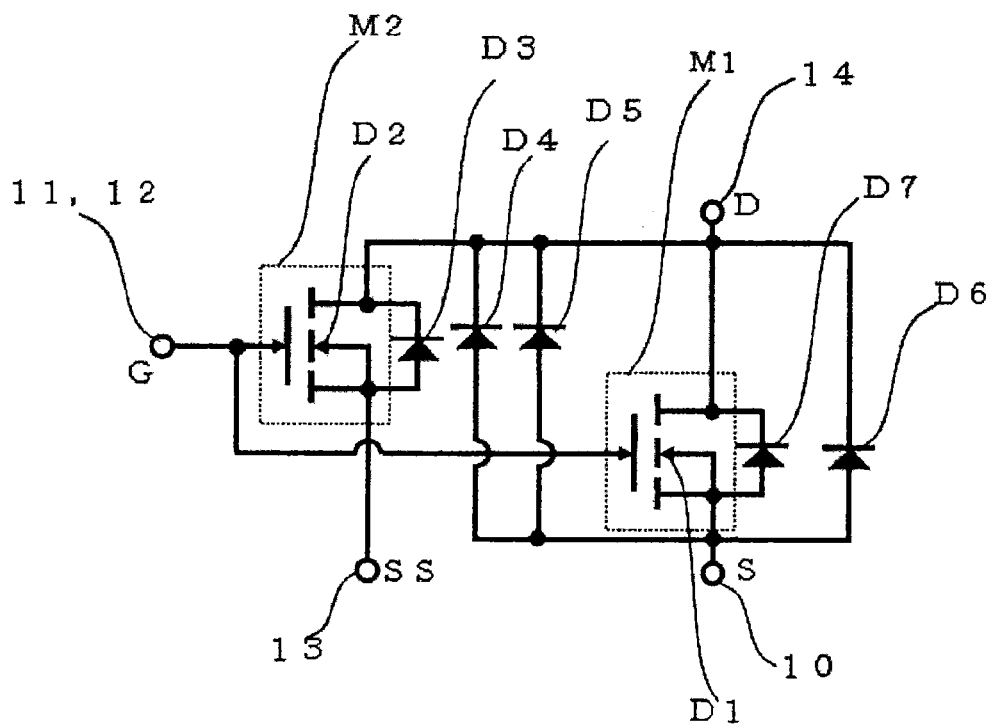
FIG. 7 is a circuit diagram for explaining an equivalent circuit model of the power semiconductor device according to Embodiment 1 of the present invention.

Next, an electrical circuit configuration of the power semiconductor device according to the embodiment will be explained. FIG. 7 is an equivalent circuit diagram explaining the configuration of the power semiconductor device according to the embodiment.

In the power semiconductor device according to the embodiment as shown in FIG. 7, a main MOSFET (a MOSFET "M1" in the main cell) includes a main-MOS diode (a body diode "D1"), and a sense MOSFET (a MOSFET "M2" in the sense cell) includes a sense-MOS diode (a body diode "D2"). The gates of the main MOSFET (M1) and the sense MOSFET (M2) are connected to the gate pad 11 or the gate wiring 12. The sources of the main MOSFET (M1) and the sense MOSFET (M2) are connected to the source pad 10 and the sense pad 13, respectively.

As explained in FIG. 3 and FIG. 4, the p-n diodes (D1 to D7) are formed between the n-type drift layer 21 and the respective p-type well regions (41 to 47), and the cathode of each of the diodes is connected to the drain electrode 14. The anodes of the main-MOS diode (D1), the sense-pad diode (D4), the sense-pad-boundary diode (D5), the periphery-well diode (D6), and the periphery-boundary-well diode (D7) are connected to the source pad 10; the anodes of the sense-MOS diode (D2) and the sense-cell-periphery diode (D3) are connected to the sense pad 13.

Next, the operations of the power semiconductor device according to the embodiment will be explained. When voltage is applied to the gate pad 11 (the gate wiring 12) of the equivalent circuit diagram in FIG. 7 so that the main MOSFET (M1) and the sense MOSFET (M2) switch from ON state to OFF state, the drain voltage of the main MOSFET (M1) and the sense MOSFET (M2), that is, the voltage of the drain electrode 14 rapidly rises from approximately zero volts to several hundred volts. Then, electric charges stored in the main-MOS diode (D1), the sense-MOS diode (D2), the sense-cell-periphery diode (D3), the sense-pad diode (D4), the sense-pad-boundary diode (D5), the periphery-well diode (D6) and the periphery-boundary-well diode (D7) move in a manner that electric charges in cathode side move from the drift layer 21 through the substrate 20 to the drain electrode 14, and electric charges in anode side move from the well regions 41 to 47 and the JTE region 40 through the respective contact holes to the source pad 10 or the sense pad 13. Here, these electric charge movements become displacement currents.

At this moment, the displacement current flowing in anode side generates a voltage determined by the displacement current value and a resistance value of regions where the displacement current flows, including contact resistances in the vicinities of the contact hole. Because the main-cell well regions 41 and the sense-cell well regions 42 are each separated into an individual unit cell and do not have large areas to have small inner parasitic resistances, even if the current is large, the generated voltage stays within a certain level. On the other hand, because the sense-pad well region 44 and a p-type region including the periphery well region 46 and the JTE region 40 connecting thereto have large areas and have well regions distant from the contact holes to have relatively large resistances of current paths, large voltages are generated in the vicinities of the contact holes.

In addition, the larger a variation dV/dt in the drain voltage V with respect to time t, the larger the voltages generated in the vicinities of the contact holes.

If the gate electrodes 50 are formed on the gate insulating films 30 positioned on well regions where such a large electric potential is generated, a dielectric breakdown sometimes occurs at a portion of the gate insulating films 30 between the gate electrodes 50 of MOSFETs that are in OFF state of approximately zero volts and a portion where the large electric potential is generated.

In the power semiconductor device according to the embodiment, the sense-pad well region 44 having a large area is covered with the field insulating film 31 thicker than the gate insulating films 30, and the gate electrodes 50 are formed on the field insulating film 31. Therefore, even in a case in which an operation under a high dV/dt condition generates a large voltage in the sense-pad well region 44 caused by a displacement current, the strength of electric field generated in the gate insulating films 30 can be reduced, giving a high reliability to the power semiconductor device.

Here, explanation will be made anew about a high speed drive operation, i.e. a high dV/dt drive operation, of a MOSFET made of wide band-gap semiconductor material such as silicon carbide.

A conventional Si-MOSFET, i.e. a unipolar element in which Si (silicon) is used, is operated at a relatively high speed of 20 V/nsec or higher; because conduction losses greatly increase when operated at a voltage of around 1 kV or higher, the operational voltage has been limited in a range from several tens volts to several hundred volts. Thus, in a high voltage range around 1 kV or higher, an Si-IGBT (Insulated Gate Bipolar Transistor) has been exclusively used. However, because the IGBT is a bipolar element, it has been difficult to have a high-speed switching property such as a unipolar element because of the minority carrier effect. More specifically, because the increase in dV/dt cannot greatly reduce the switching loss, it has been used, at the most, at an operation speed of around several volts per nanosecond.

On the other hand, a MOSFET in which wide band-gap semiconductor material such as silicon carbide is used can have a small conduction loss in a high voltage range higher than 1 kV. Furthermore, the MOSFET is a unipolar element capable of being operated at a high speed, and its high-speed switching operation can reduce its switching loss. Therefore, the losses when operating as an inverter can be further reduced.

In such an environment of operation, for example a high-speed switching operation at 10 V/nsec or faster in a high voltage range of 1 kV or higher, in which the conventional Si element has not been used, a displacement current produced during the switching as described in the explanation of Patent document 1 generates a more prominent voltage in the P-wells.

Moreover, in a case where such a MOSFET is formed of silicon carbide semiconductor material, p-type impurity elements do not exist at a sufficiently shallow level in the silicon carbide band gap; thus, p-type silicon carbide having a low electrical resistivity at room temperature cannot be obtained, and the contact resistance between the p-type silicon carbide and metal becomes large. Therefore, in the case where a MOSFET power semiconductor device is configured of silicon carbide, the contact resistance value between metal and P-wells configured of p-type silicon carbide becomes large, so that a large voltage is generated by the displacement current.

These are the reasons why a high dV/dt drive operation of a MOSFET power semiconductor device with a wide band-gap semiconductor material, especially with silicon carbide, produces a very high voltage by displacement current during switching.

On the other hand, in the power semiconductor device configured of wide band-gap semiconductor material according to the embodiment, an operation even in a high dV/dt condition such as 10 V/nsec can reduce the electric field applied to a silicon dioxide film, i.e. the gate insulating films 30, to around 3 MV/cm or less; thus a highly reliable power semiconductor device can be obtained.

Moreover, according to the manufacturing method of the power semiconductor device explained in the embodiment, portions in the field insulating films 31 where contact holes penetrate are processed in the same manner as portions where the gate insulating films 30 are formed, whereby the power semiconductor device according to the embodiment can be manufactured without increasing manufacturing steps compared to those in conventional manufacturing methods of a power semiconductor device.

Figure 8:
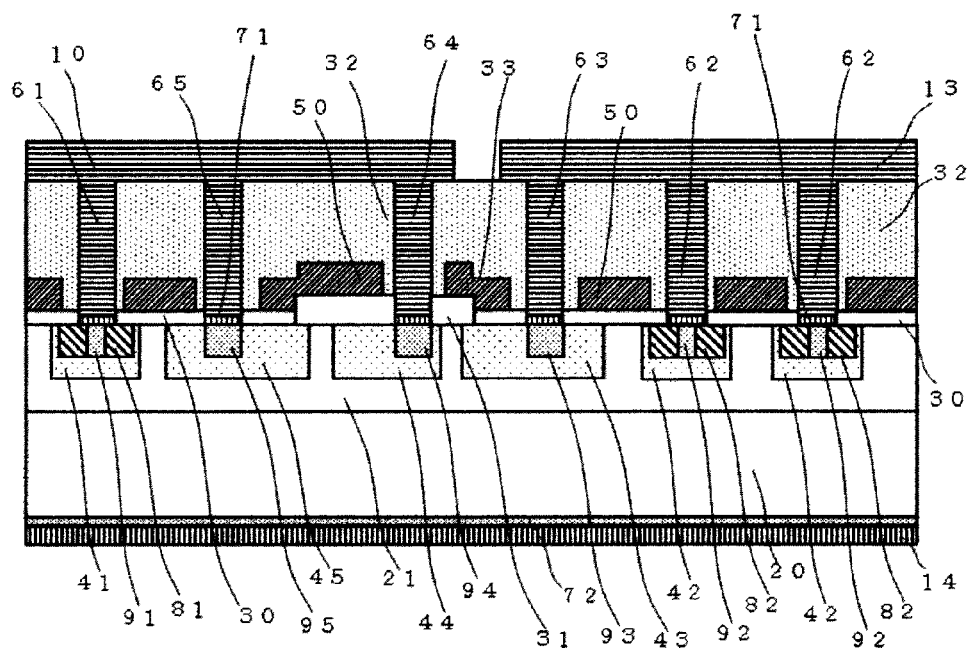
FIG. 8 is a partial schematic cross-sectional view of an aspect of the power semiconductor device according to Embodiment 1 of the present invention.

In addition, in the power semiconductor device according to the embodiment, the field insulating film 31 has a size to cover the sense-pad well region 44; however, the field insulating film 31 may cover an area larger than that of the sense-pad well region 44, and as shown in a cross-sectional view of FIG. 8, may extend to the top faces of the sense-cell-periphery well region 43 and the sense-pad-boundary well region 45.

A structure shown in the cross-sectional view of FIG. 8 can reduce influences from the voltage generated by displacement current at end portions of the field insulating film 31.

Figure 9:
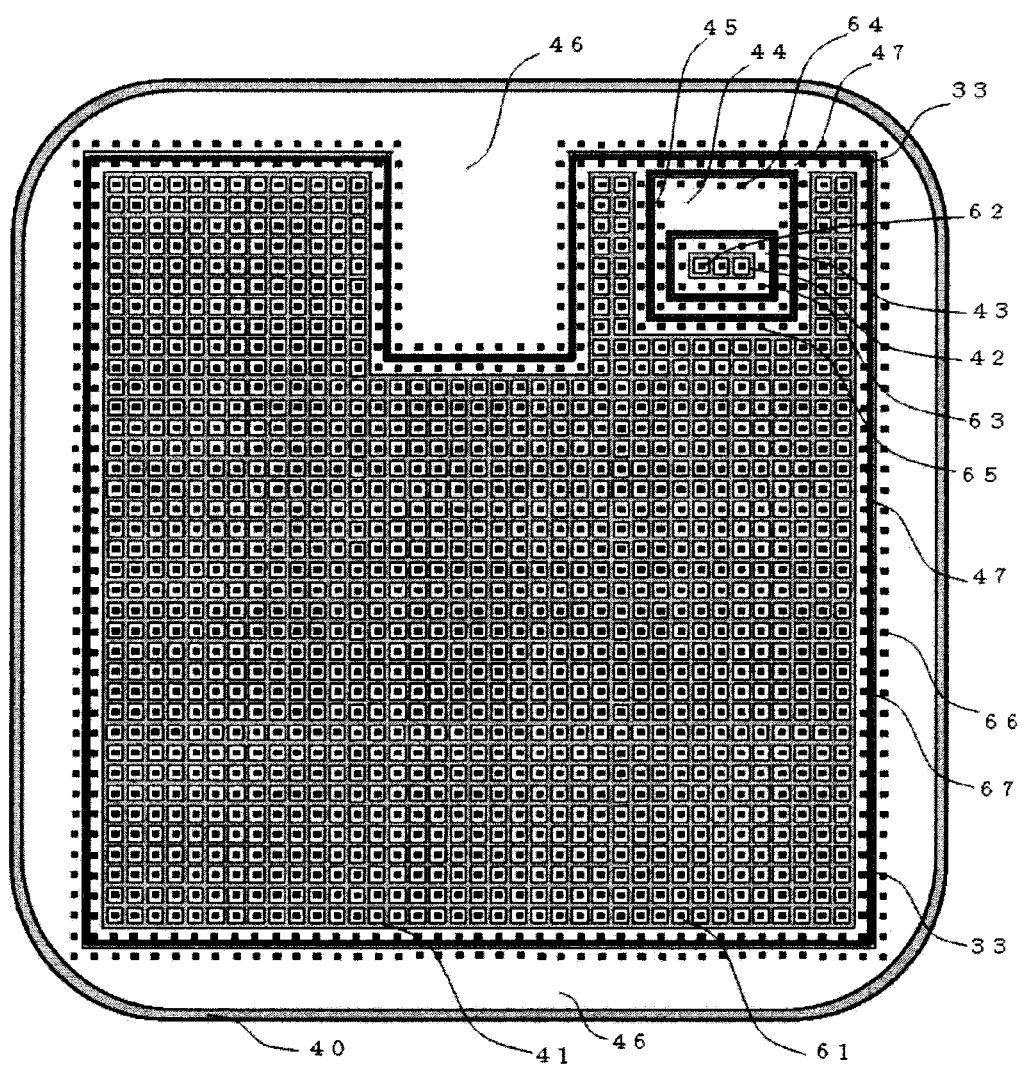
FIG. 9 is a schematic plan view of another aspect of the power semiconductor device according to Embodiment 1 of the present invention.

Moreover, the sense-pad-boundary well region 45 and the periphery-boundary well region 47 may be formed to connect to each other. FIG. 9 is a plan view mainly showing a silicon carbide layer of a power semiconductor device in which the sense pad 13 is formed adjacent to the gate wiring 12. FIG. 9 shows that the sense-pad-boundary well region 45 and the periphery-boundary well region 47 have a common region.

Figure 10:
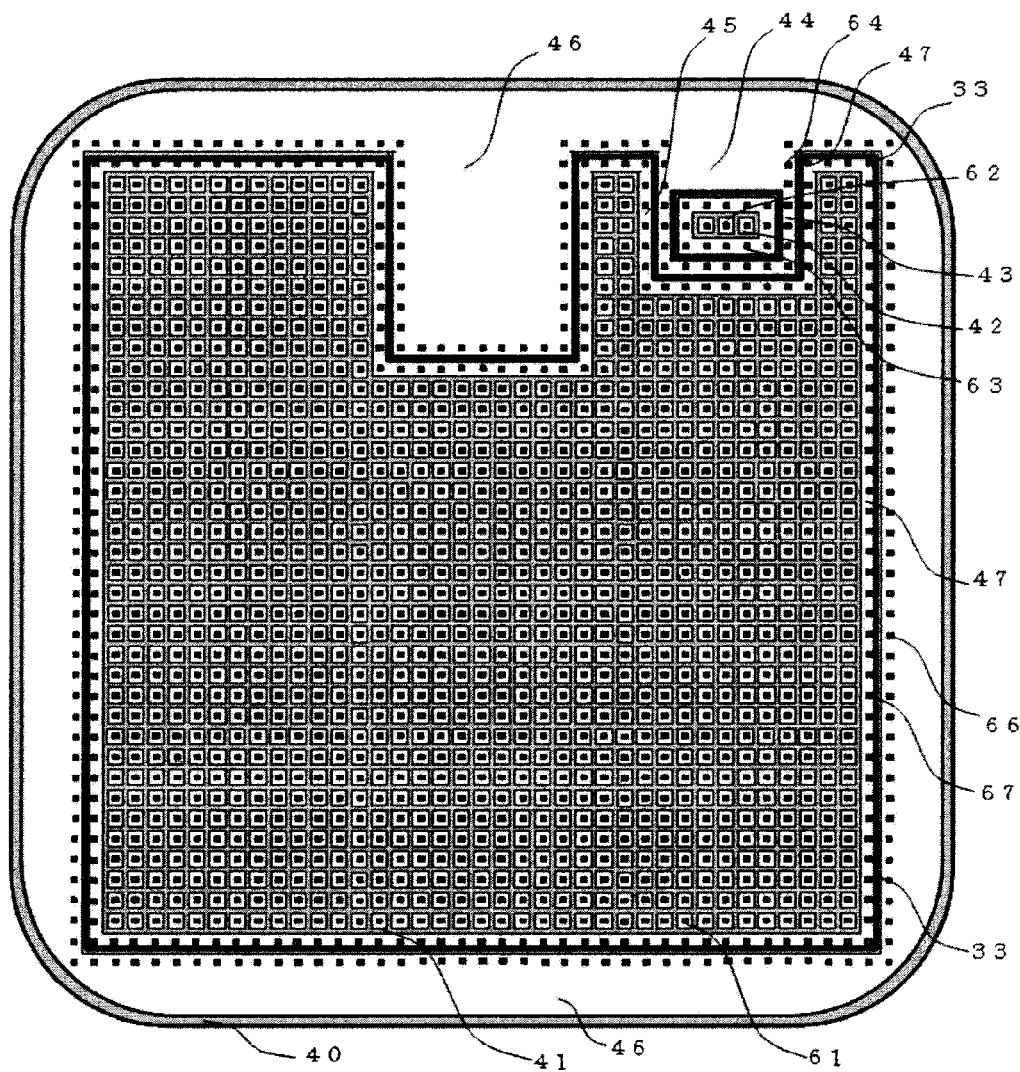
FIG. 10 is a schematic plan view of another aspect of the power semiconductor device according to Embodiment 1 of the present invention.

Moreover, when the sense pad 13 and the gate wiring 12 are separated and the sense pad 13 has an area smaller than the gate pad 11, the field insulating films 31 may be connected to each other under the sense pad 13 and the gate wiring 12, as shown in a perspective plan view in FIG. 10.

Figure 11:
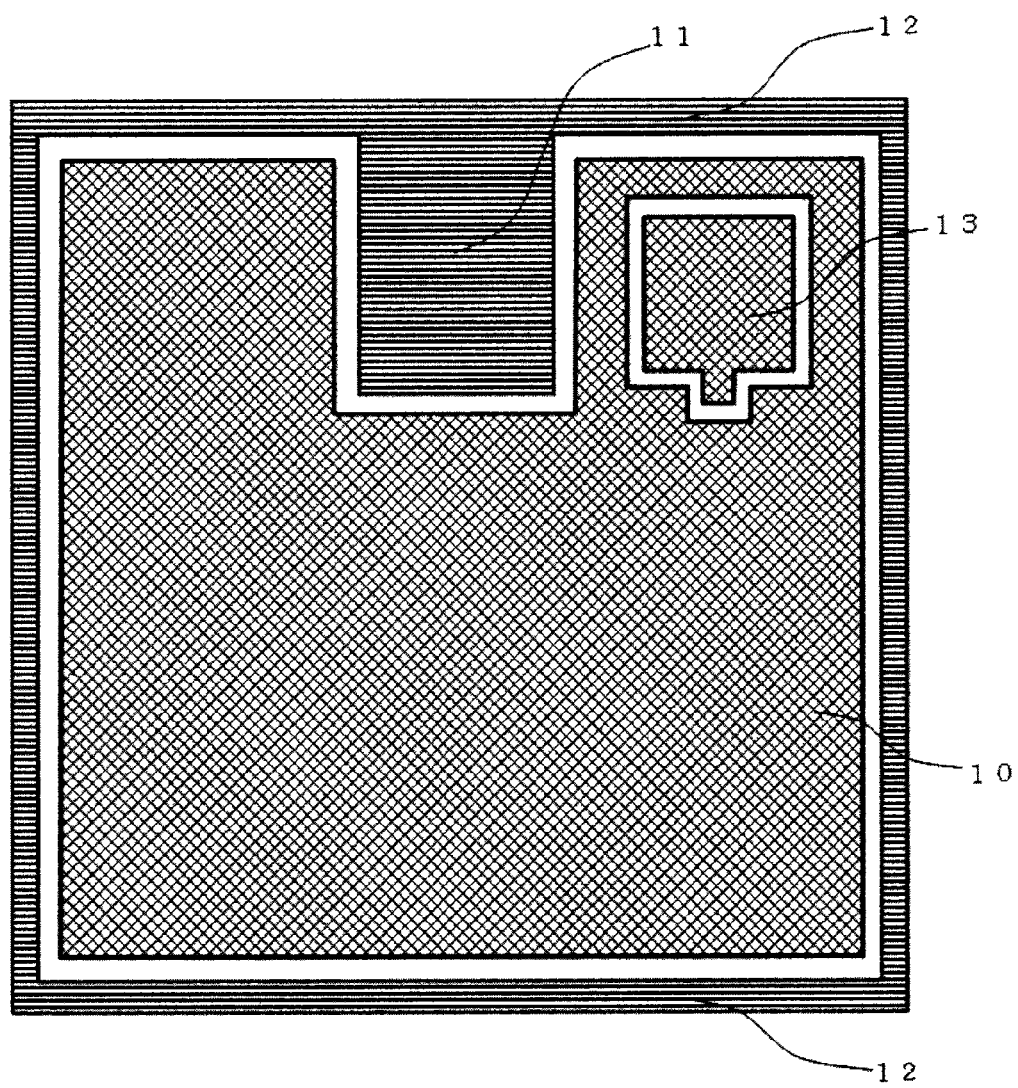
FIG. 11 is a schematic plan view of another aspect of the power semiconductor device according to Embodiment 1 of the present invention.

In addition, the shapes of the source pad 10, the gate pad 11, the sense pad 13 and the like are not limited to those shown in the embodiment, and other shapes may be allowed. For example, the shape of the sense pad 13 has been shown as a rectangular; however, as shown in its top face view in FIG. 11, its shape may include a portion protruding from a rectangular portion, and sense cells (sense-cell well regions 42) may be formed under the protruding portion. Formation of the sense cells under the protruding portion can minimize influences onto the properties of the sense cells even when a wire bonded portion is formed on the main portion (the rectangular portion) of the sense pad 13.

Figure 12:
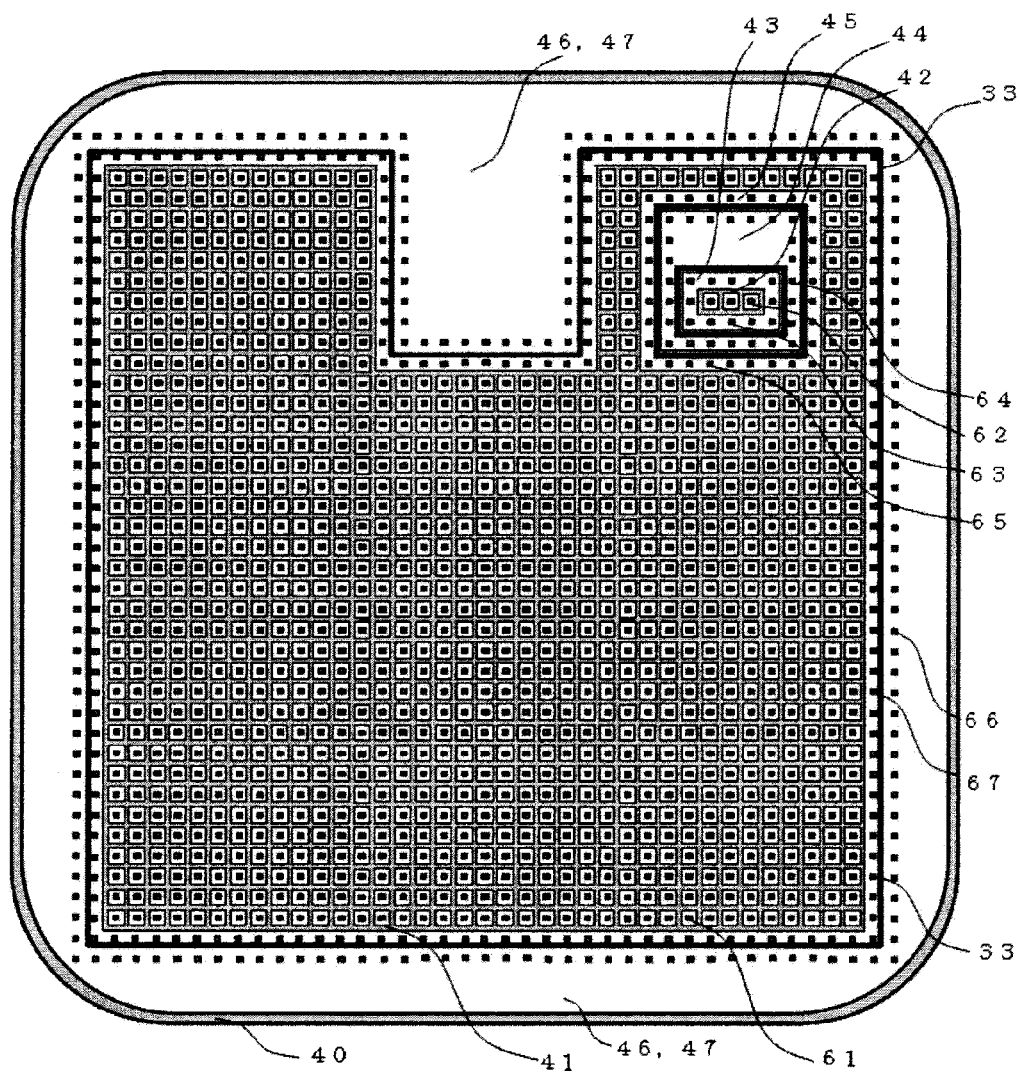
FIG. 12 is a schematic plan view of another aspect of the power semiconductor device according to Embodiment 1 of the present invention.

Moreover, the periphery well region 46 and the periphery-boundary well region 47 may be formed so as to be connected with each other, as shown in a perspective plan view in FIG. 12.

The power semiconductor device according to the embodiment is configured of silicon carbide semiconductors; therefore, in the area outside the gate wiring 12, there are not provided wiring called as field ring, wiring connected to the field stopper region 83, and wiring of a ground potential called as a field plate, that are generally used in silicon semiconductors. This is because silicon carbide semiconductors themselves have a large dielectric breakdown electric field.

Moreover, the spaces between adjacent wells may be identical, or different. For example, it is preferable that the space between the sense-cell-periphery well region 43 and the sense-pad well region 44, the space between the sense-pad well region 44 and the sense-pad-boundary well region 45, and the space between the periphery well region 46 and the periphery-boundary well region 47 are narrower than the space between neighboring main cells, because the field insulating films 31 are formed entirely or partially over these spaces. An excessively wide space between the well regions increases the electric field applied to a insulating film such as the field insulating films 31 over the space, sometimes lowering the reliability of the power semiconductor device.

In addition, the back ohmic contact 72 and the ohmic contacts 71 may be formed at the same time by annealing. Material such as an intermetallic compound for the ohmic electrodes 71 may be the same or different according to contact holes. The ohmic electrodes 71 used for the source contact holes 61 and the like are required to be in ohmic contact with both of n-type silicon carbide and p-type silicon carbide; however, it suffices that the ohmic electrodes 71 used for the respective well contact holes are in ohmic contact with the p-type silicon carbide. Therefore, the ohmic electrodes are suitably selected depending on their purposes.

Moreover, when heat treatment is performed for forming silicide for the ohmic electrodes 71, re-heat treatment may be performed after removing metal films remaining on the interlayer insulating film 32. The re-heat treatment at a higher temperature can produce ohmic contacts having lower resistances. Moreover, when the heat treatment for forming silicide for the ohmic electrodes 71 is performed, if the gate contact holes have been formed, silicide is formed from the polysilicon gate electrodes 50 and metal film, causing the gate contacts to have low resistance.

In addition, in the power semiconductor device according to the embodiment, the electric potentials of large area well regions such as the sense-pad well region 44 and the periphery well region 46 are fixed. Therefore it is not necessary to provide a structure such as a field plate, minimizing the device.

Embodiment 2

Figure 13:
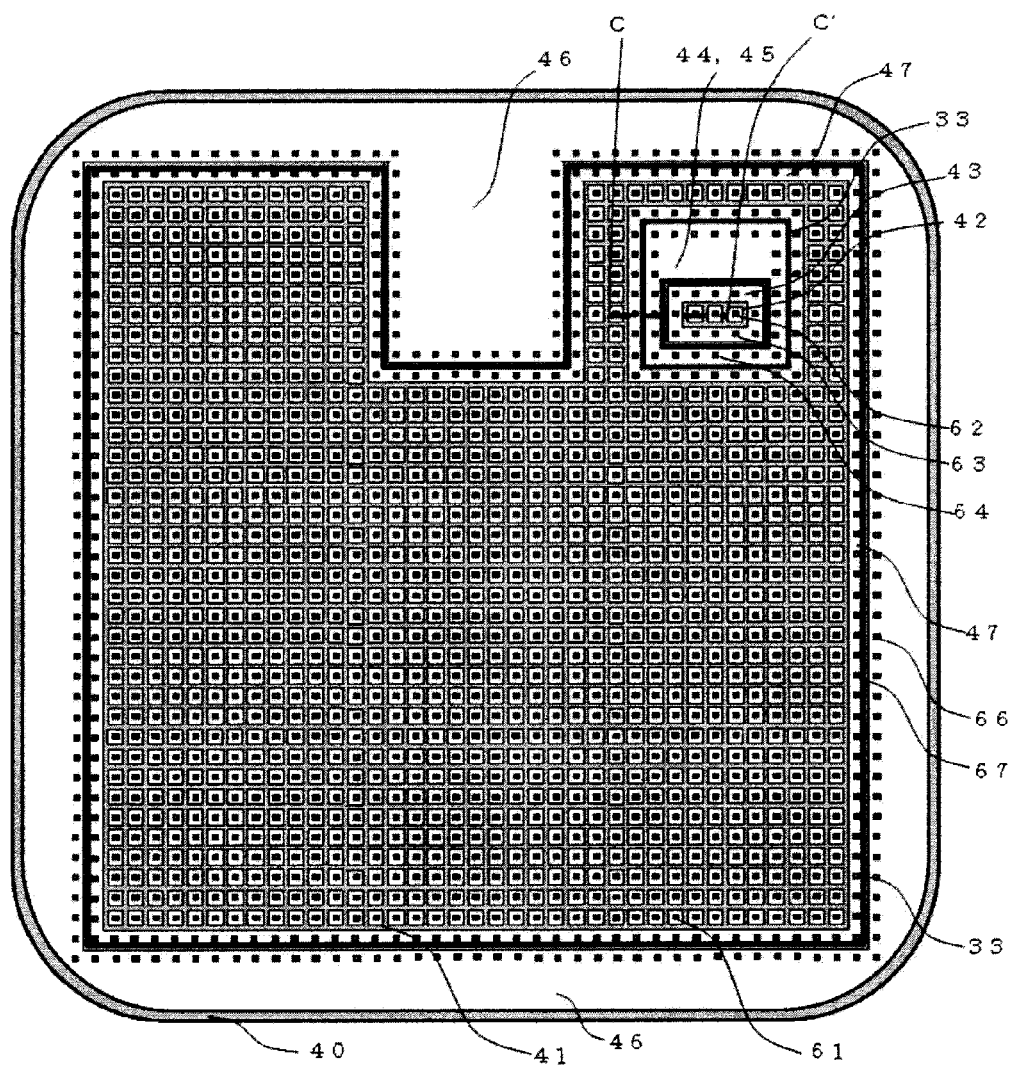
FIG. 13 is a schematic plan view of a power semiconductor device according to Embodiment 2 of the present invention.
Figure 14:
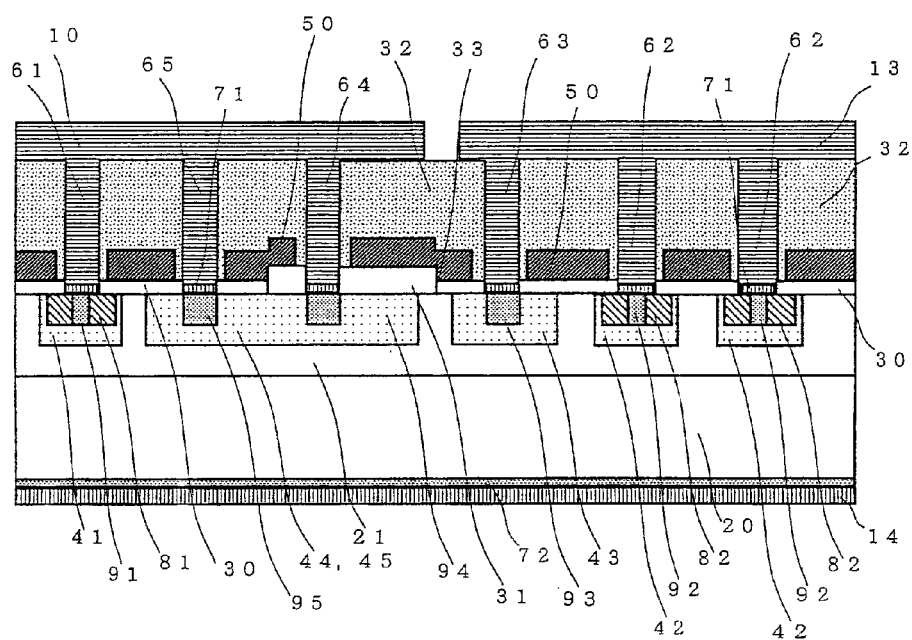
FIG. 14 is a partial schematic cross-sectional view of the power semiconductor device according to Embodiment 2 of the present invention.

FIG. 13 is a perspective plan view of a power semiconductor device according to Embodiment 2 of the present invention seen from the above. FIG. 14 is a partial schematic cross-sectional view of the power semiconductor device according to the embodiment, taken along C-C' in the plan view shown in FIG. 13.

FIG. 13 and FIG. 14 show that in the power semiconductor device according to this embodiment, the p-type sense-pad well region 44 and the p-type sense-pad-boundary well region 45 of the power semiconductor device according to Embodiment 1 are formed to connect to each other, and the sense-pad well contact holes 64 are formed close to the sense-pad-boundary well contact holes 65. The sense-pad well region 44 is electrically connected to the source pad 10. Other components are the same as those explained in Embodiment 1, and therefore their explanations will be omitted.

Even in this embodiment, the sense-pad well region 44 having a large area is covered with the field insulating film 31; therefore, even in a case where an operation in a high dV/dt condition produces a displacement current in the sense-pad well region 44 to generate a large voltage, the electric field generated in the gate insulating films 30 can be suppressed, giving a high reliability to the power semiconductor device.

Moreover, similarly to the power semiconductor device according to Embodiment 1, the periphery well region 46 and the periphery-boundary well region 47 may be formed so as to be connected with each other.

In Embodiments 1 and 2 described above, cases are disclosed in which semiconductor elements formed in the cell regions are vertical MOSFETs. However, even if a semiconductor element having IGBT cell regions is configured by providing, for example, a collector layer of the second conductivity type between the substrate 20 and the back ohmic electrode 72 on the back face side shown in FIG. 3, the same effect of the invention as described above is given to the semiconductor element having IGBT cell regions. Therefore, the range of the effect brought by the present invention includes a semiconductor element such as a MOSFET and an IGBT that have a MOS structure to serve as a switching element. In addition, in a case where such a semiconductor element is an IGBT, the MOSFET's drain corresponds to a collector, and the MOSFET's source corresponds to an emitter.

Moreover, in a trench-type MOSFET in which channel regions of main cells and sense cells are formed perpendicularly to the surface of a substrate 20, by providing sense-pad well contact holes 64 that penetrate field insulating films 31 under a sense pad 13 so as to connect to a sense-pad well region 44, a voltage that displacement current generates at around gate insulating films 30 in the vicinity of a sense pad having a large area can be reduced even in a high speed switching OFF case, thereby reducing the strength of the electric field induced in the gate insulating films 30.

In addition, if a power semiconductor device is provided with the power semiconductor device structure described in Embodiments 1 or 2, the effect of the present invention does not depend on manufacturing methods; therefore, a high reliability can be also given to the power semiconductor device manufactured by a manufacturing method other than that described in Embodiment 1.

Moreover, in the present invention, semiconductor elements themselves having a MOSFET structure described in Embodiments 1 and 2 are defined as "semiconductor devices" in a narrow sense; in a broad sense, also defined as a "semiconductor device" is, for example, a semiconductor-element-incorporated power module itself such as an inverter module that is mounted on a lead frame and sealed with a semiconductor element having the MOSFET structure, a freewheel diode connected in parallel to the semiconductor element in a reverse direction, a control circuit for generating a voltage to be applied to the semiconductor element gate, and the like.

[NumeralS]
  10 source pad
  11 gate pad
  12 gate wiring
  13 sense pad
  14 drain electrode
  20 substrate
  21 drift layer
  30 gate insulating film
  31 field insulating film
  32 interlayer insulating film
  33 gate-insulating-film field-insulating-film boundary
  40 JTE region
  41 main-cell well region
  42 sense-cell well region
  43 sense-cell-periphery well region
  44 sense-pad well region
  45 sense-pad-boundary well region
  46 periphery well region
  47 periphery-boundary well region
  50 gate electrode
  61 source contact hole
  62 sense source contact hole
  63 sense-cell-periphery well contact hole
  64 sense-pad well contact hole
  65 sense-pad-boundary well contact hole
  66 periphery-well contact hole
  67 periphery-boundary-well contact hole
  68 gate contact hole
  71 ohmic electrode
  72 back ohmic electrode 81 main source region
82 sense source region
83 field stopper region
91-97 contact region
D1 main-MOS diode
D2 sense-MOS diode
D3 sense-cell-periphery diode
D4 sense-pad diode
D5 sense-pad-boundary diode
D6 periphery-well diode
D7 periphery-boundary-well diode
M1 main MOSFET
M2 sense MOSFET

The invention claimed is:

1. A power semiconductor device comprising:
a semiconductor substrate of a first conductivity type;
a drift layer of the first conductivity type that is formed on a first main face of the semiconductor substrate;
a plurality of main-cell well regions of a second conductivity type that are formed side by side in upper surface portions of the drift layer;
a plurality of sense-cell well regions of the second conductivity type that are formed side by side in upper surface portions of the drift layer, apart from the main-cell well regions;
a sense-pad well region of the second conductivity type in the upper surface portions of the drift layer apart from the sense-cell well regions and the main-cell well regions;
a gate insulating film that is formed on the sense-cell well regions and the main-cell well regions;
a field insulating film, which is thinker than the gate insulating film, that is formed to cover the entire region of the sense-pad well region except for portions on which a sense-pad well contact hole is provided;
a source pad that electrically connects 1)the sense-pad well region through sense-pad well contact holes which are formed on the sense-pad well region so as to penetrate the field insulating film and 2) the main-cell well regions through source contact holes which are formed on the main-cell well regions so as to penetrate the gate insulating film at positions apart from the field insulating film;
a sense pad that is electrically connected to the sense-cell well regions through sense source contact holes which are formed on the sense-cell well regions so as to penetrate the gate insulating film;
gate electrodes that are formed in contact with the gate insulating film, above the main-cell well regions and the sense-cell well regions, the gate electrodes also being formed on the sense-pad well region and the field insulating film on the sense-pad well region;
a gate pad that is electrically connected to the gate electrodes; and
a drain electrode that is formed on a second main face side of the semiconductor substrate that is opposite to the first main face.

2. The power semiconductor device according to claim 1, further comprising:
a sense-cell-periphery well region of the second conductivity type that is formed between the plurality of sense-cell well regions and the sense-pad well region so as to be apart from the sense-cell well regions and the sense-pad well region; and
sense-cell-periphery well contact holes that are formed on the sense-cell-periphery well region so as to electrically connect the sense pad to the sense-cell-periphery well region.

3. The power semiconductor device according to claim 1, further comprising:
a sense-pad-boundary well region of the second conductivity type that is formed to surround the sense-pad well region; and
sense-pad-boundary well contact holes that are formed on the sense-pad-boundary well region so as to electrically connect the source pad to the sense-pad-boundary well region.

4. The power semiconductor device according to claim 3, wherein the sense-pad well region and the sense-pad-boundary well region are connected in the drift layer.

5. The power semiconductor device according to claim 1, further comprising:
a periphery well region of the second conductivity type that is formed in the drift layer so as to surround the plurality of the main-cell well regions; and
periphery-well contact holes that are formed on the periphery well region so as to penetrate the field insulating film, to electrically connect the periphery well region to the source pad.

6. The power semiconductor device according to claim 1, wherein the drift layer is made of silicon carbide.

7. The power semiconductor device according to claim 2, further comprising:
a periphery well region of the second conductivity type that is formed in the drift layer so as to surround the plurality of the main-cell well regions; and
periphery-well contact holes that are formed on the periphery well region so as to penetrate the field insulating film, to electrically connect the periphery well region to the source pad.

8. The power semiconductor device according to claim 3, further comprising:
a periphery well region of the second conductivity type that is formed in the drift layer so as to surround the plurality of the main-cell well regions; and
periphery-well contact holes that are formed on the periphery well region so as to penetrate the field insulating film, to electrically connect the periphery well region to the source pad.

9. The power semiconductor device according to claim 4, further comprising:
a periphery well region of the second conductivity type that is formed in the drift layer so as to surround the plurality of the main-cell well regions; and
periphery-well contact holes that are formed on the periphery well region so as to penetrate the field insulating film, to electrically connect the periphery well region to the source pad.

10. The power semiconductor device according to claim 2, wherein the drift layer is made of silicon carbide.

11. The power semiconductor device according to claim 3, wherein the drift layer is made of silicon carbide.

12. The power semiconductor device according to claim 4, wherein the drift layer is made of silicon carbide.

13. The power semiconductor device according to claim 5, wherein the drift layer is made of silicon carbide.

14. The power semiconductor device according to claim 7, wherein the drift layer is made of silicon carbide.

15. The power semiconductor device according to claim 8, wherein the drift layer is made of silicon carbide.

16. The power semiconductor device according to claim 9, wherein the drift layer is made of silicon carbide.

* * * * *